(12) United States Patent
Lin et al.

(10) Patent No.: US 6,764,877 B2
(45) Date of Patent: Jul. 20, 2004

(54) METHOD OF DISSIPATING STATIC ELECTRIC CHARGE FROM A CHIP ASSEMBLY DURING A MANUFACTURING OPERATION

(75) Inventors: Arthur K. Lin, Phoenix, AZ (US); Robert A. Anderson, Elkgrove, CA (US); Kuljeet Singh, Orangevale, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/374,415

(22) Filed: Feb. 25, 2003

(65) Prior Publication Data

US 2003/0137038 A1 Jul. 24, 2003

Related U.S. Application Data

(62) Division of application No. 09/425,275, filed on Oct. 21, 1999, now Pat. No. 6,566,741.

(51) Int. Cl.[7] .............................................. H01L 21/44
(52) U.S. Cl. ........................................ 438/106; 438/121
(58) Field of Search .................................. 438/106, 121

(56) References Cited

U.S. PATENT DOCUMENTS

| 5,635,671 A | 6/1997 | Freyman et al. |
| 5,894,410 A | 4/1999 | Barrow |
| 6,150,193 A | 11/2000 | Glenn |
| 6,214,645 B1 * | 4/2001 | Kim .......................... 438/110 |

* cited by examiner

Primary Examiner—Thanh Nguyen
(74) Attorney, Agent, or Firm—Robert C. Winkle (57) ABSTRACT

An apparatus and method for dissipating static electrical charge following a manufacturing operation is disclosed. A semiconductor package is provided with ground pads that are located to assure electrical contact with ejection pins used to translate the package from one position to another. Static electricity builds up on the semiconductor package. The ejection pins provide the pathway for dissipating static electrical charge out of the semiconductor package.

4 Claims, 7 Drawing Sheets

METHOD OF DISSIPATING STATIC ELECTRIC CHARGE FROM A CHIP ASSEMBLY DURING A MANUFACTURING OPERATION

The present patent application is a Divisional of application Ser. No. 09/425,275 filed Oct. 21, 1999 now U.S. Pat. No. 6,566,741.

FIELD OF THE INVENTION

The present invention relates to the field of semiconductor packages. More specifically, the invention relates to a method of providing grounding of a package substrate to dissipate static charge buildup during a step in the assembly of the package.

RELATED ART

An ongoing issue with manufacturing semiconductors is to maintain quality of the part, and to reduce the time spent during each manufacturing step. The issue is ever present in the assembly of semiconductor packages. During each step of a package assembly process, whether it be die attach, wirebond, encapsulation, or test, each assembly step requires time, from the beginning of the step through the end of the step.

One assembly step where there is opportunity to reduce the time is during the die encapsulation process. Die encapsulation may occur after a die is placed on a package substrate and wirebonded. Typically, the encapsulation step includes placing a substrate containing a wirebonded die, onto a platform. Then, an encapsulant, which may be an organic material for protecting the top surface of the package, is injected onto the top of the die to cover the die and the surrounding wirebonds.

More specifically, die encapsulation may include the following steps. First, a substrate that contains a die that is electrically bonded to the substrate, is placed onto a platform. The platform may be the bottom half of a mold chase. The substrate may be positioned onto the mold chase platform using alignment holes that are pre-drilled into the substrate. Once the substrate is centered on the mold chase platform, the top half of the mold chase lowers onto the substrate. The top half of the mold chase may contain a cavity within which a mold is to be formed. The cavity is located to cover the die as well as a portion of the substrate that surrounds the die. A channel within the top mold chase carries liquid mold material into the cavity. The liquid hardens to form a mold to encapsulate the die. Then, the top half of the mold chase separates from the mold chase bottom half. Ejection pins extending vertically through the bottom half of the mold chase press upward, to lift the substrate off of the mold chase bottom half. Finally, the substrate may be removed from the mold chase bottom, by human hand or by using a robot.

One problem that occurs during the encapsulation process is static charge buildup on the substrate. The substrate is typically made of an electrically insulating material, a flexible plastic or a hard ceramic material. Because of the insulative properties of the substrate, static charge builds up around the surface of the substrate because the substrate acts as a capacitor when placed in a mold chase having a different electrical potential from the package substrate. Because of the static charge buildup, it is important to make sure the static charge dissipates before the mold is separated from the substrate, and before the substrate is separated from the mold.

A solution to the charge dissipation problem is simply letting time pass. The substrate may contain a ground plane, to provide a pathway for electric charge dissipation. Letting time pass is not an realistic solution for high volume manufacturing, however, because of the impact to the throughput of the process step, as well as the inability to control the repeatability of the charge dissipation. Slight differences in electrical potential buildup with each pass of substrate through the mold chase, as well as electrical differences from substrate to substrate render it difficult to identify an appropriate time between end of encapsulation and separation from the mold.

It would be advantageous to provide a feature in the substrate to more quickly dissipate static electric charge buildup following a manufacturing operation.

SUMMARY OF THE INVENTION

According to the invention, there is a chip assembly comprising a semiconductor chip in electrical contact with a substrate, said substrate having a bottom and top surface, the semiconductor chip being in electrical contact with the substrate. The substrate contains at least one pad comprising an electrically conductive material, the pad being coupled to electrical ground, to provide a pathway for dissipating static electric charge that may occur during a manufacturing operation for the chip assembly.

DESCRIPTION OF THE PREFERRED EMBODIMENTS

The present invention constitutes a ground pad on a semiconductor package substrate. The invention was conceived in response to the problem of requiring a pause at the end of a manufacturing operation in which static electric charge forms on the package substrate. To facilitate dissipation of static electric charge from the semiconductor package substrate, at least one ground pad is provided on a surface of the substrate so that the electric charge dissipates through the ground pad. An embodiment of the invention includes locating the ground pad at or near the site at which ejection pins from a manufacturing operation come into contact with the package substrate. The ejection pins provide a direct pathway for charge dissipation.

The invention will be described below, in the context of a strip of several wirebonded, ball grid array semiconductor packages placed in a mold chase for a molding operation. The context should be viewed as illustrative only and not for limiting the scope of the invention.

Figure 1:
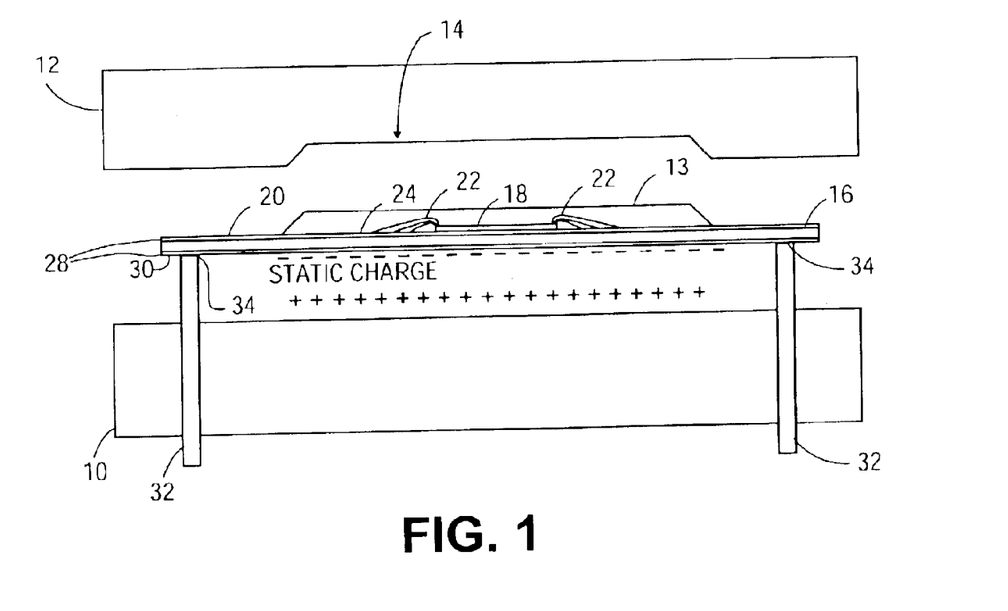
FIG. 1 is a side view of a package substrate within a mold chase in an embodiment of the present invention.

Referring to FIG. 1, bottom mold chase 10 and top mold chase 12. The mold chase operates to provide a shape and form to a polymer protective cap 13 that encapsulates and protects a chip assembly (also called herein "semiconductor package"). Top mold chase 12 includes an indentation 14, in conformance with the desired dimensions of protective cap 13. When bottom mold chase 10 and top mold chase 12 are clamped together, a pellet of encapsulant material (not shown) is introduced into top mold chase 12. The mold chase is heated to a melting point for the encapsulant material, and the material flows over the semiconductor package to form protective cap 13.

A substrate 16 is shown in side view, between bottom mold chase 10 and top mold chase 12. Substrate 16 described herein is an organic laminated material that contains a pre-designed set of electrical pathways to provide electrical contact between a semiconductor die and a board. Die 18 is shown placed onto the top surface 20 of substrate 16. Die 18 and substrate 16 are in electrical contact by way of a set of wirebonds 22. Wirebonds 22 directly contact bond pads (not shown) on the periphery of die 18 and extend from the bond pads to corresponding substrate pads 24 on substrate 16. A solder mask 28 protects substrate top surface 20 as well as the bottom surface 30 of substrate 16 such that, openings within solder mask 28 provide for placement of electrical contacts with external components or boards. The remainder of top surface 20 and bottom surface 30 of substrate 16 is covered with solder mask 28. Note that, substrate 16 forms a capacitor such that static electrical charge may build up on the surfaces of substrate 16.

Substrate 16 is shown in FIG. 1 in an upwardly lifted position. Ejection pins 32 move in a vertical direction through bottom mold chase 10 to lift substrate 16 up and down from bottom mold chase 10. In accordance with an embodiment of the present invention, ground pads 34 are located on the substrate 16 bottom surface 30 in alignment with ejection pins 32. When ejection pins 32 contact substrate 16 to translate substrate 16 from one vertical position to another vertical position, ejection pins 32 physically contact ground pads 34. Ejection pins 32 may contact the entire surface of ground pads 34 or a portion of ground pads 34. Contact between ejection pins 32 and ground pads 34 may alternatively be physically indirect. The key to making the present invention work is to provide a mechanism for dissipating static charge buildup through ground pads. An embodiment is to use ejection pins 32 as the dissipation path. The invention allows for a predictable pause after the molding operation (or other operation where electrical charge buildup may occur) is complete, at such time that charge dissipation can occur, either through ejection pins 32 or another mechanism.

Figure 2:
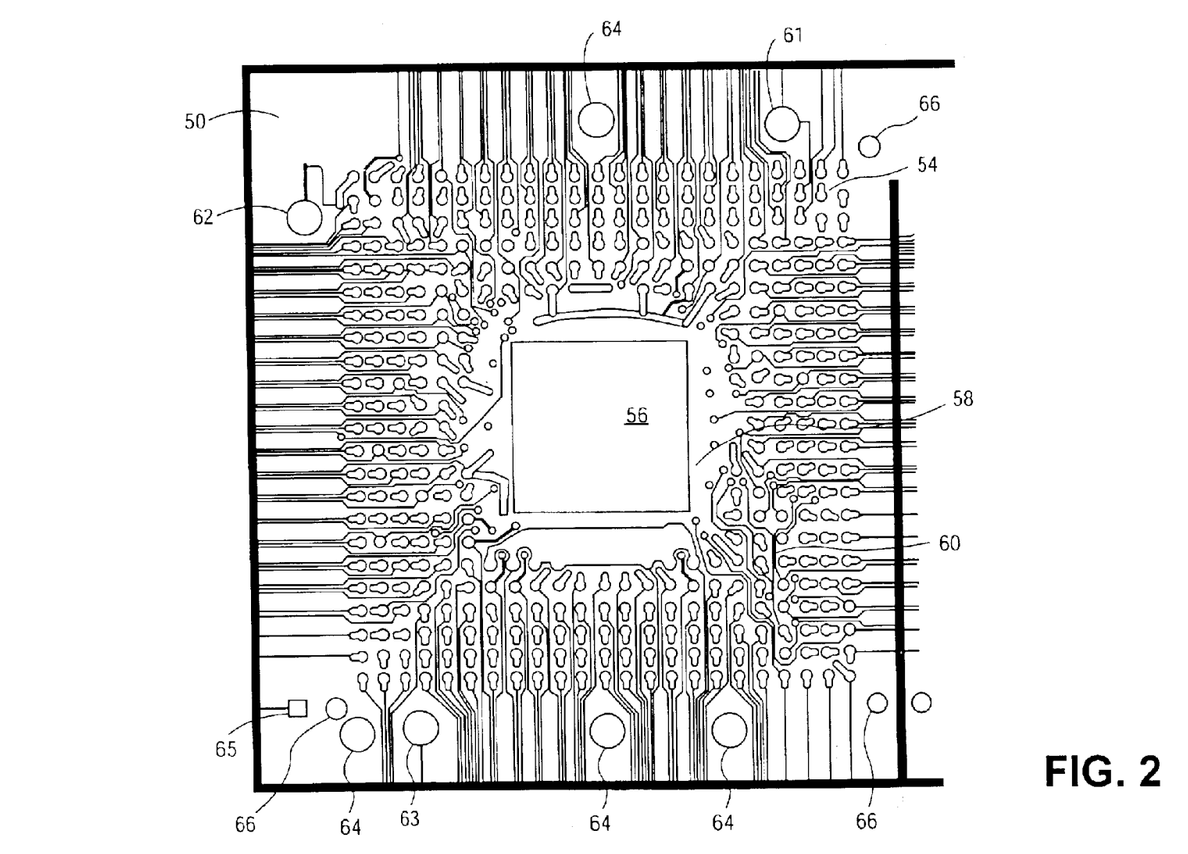
FIG. 2 is view of the bottom surface of a strip of ball grid array package substrates, showing ground pads located outside of the periphery of the ball grid array in accordance with an embodiment of the present invention.

FIG. 2 illustrates a diagram of one package substrate in a strip 50 of package substrates. Strip 50 includes a top side (not shown) and bottom side. The bottom side is illustrated in FIG. 2. The bottom side includes a ball grid array 54 that electrically and physically couples the package substrate to a printed circuit board (not shown). Ball grid array 54 includes a center shadow portion 56 that represents the area on the opposing side of strip 50, on which a semiconductor die would reside. There is an open area 58 that does not contain balls. Several routing leads 60 provide wiring to connect various electrical features of the package together. Additional detail on the design of the type of ball grid array package illustrated here can be found in Barrow, U.S. Pat. No. 5,894,410, "Perimeter matrix ball grid array circuit package with a populated center."

Ground pads 61, 62, and 63 are located on the bottom side of strip 50. The specific placement of ground pads 61, 62 and 63 is designed so that ground pads 61, 62 and 63 will be aligned with and be in direct physical contact with ejection pins on a mold chase. Although ground pads 61, 62 and 63 are shown in a particular placement on strip 50, the placement of and number of ground pads on other parts of strip 50 is dependent on the location of and number of ejection pins for the molding operation in which the embodiment of this invention is used. Ground pads 61, 62 and 63 may be made of any electrically conductive material and are preferably fabricated from a metal such as gold or copper. Tooling holes 64 help to center strip 50 when it is first placed on a mold chase for molding. Alignment mark 65 provides a basis for aligning strip 50 in a manufacturing operation requiring such alignment. Stress relief holes 66 provide physical stress relief and are designed to accommodate stress issues of the selected package material.

Note that ground pads 61, 62 and 63 are located on the exterior of ball grid array 54. Ball grid array 54 may include electrically conductive pads to which solder balls are coupled. By placing ground pads 61, 62 and 63 externally to ball grid array 54, ground pads 61, 62 and 63 serve their purpose of dissipating static electrical charge without consuming real estate within ball grid array 54. The size and shape of ground pads 61, 62 and 63 may vary depending on the size and shape of the contact to which static charge would dissipate. In the case of ejection pins, the size of ground pads 61, 62 and 63 should be such that, there is sufficient metal-to-metal contact with the tip of the ejection pins to dissipate the static charge in less than a pre-specified time. Ground pads 61, 62 and 63 should be as small as possible in surface area, to avoid using any more metal than necessary to achieve the static charge dissipation desired. Ground pads 61, 62 and 63 are electrically coupled to electrical ground, either by being routed to a solder ball for electrical ground, or by being connected through a via, to an embedded ground plane within strip 50.

Figure 3:
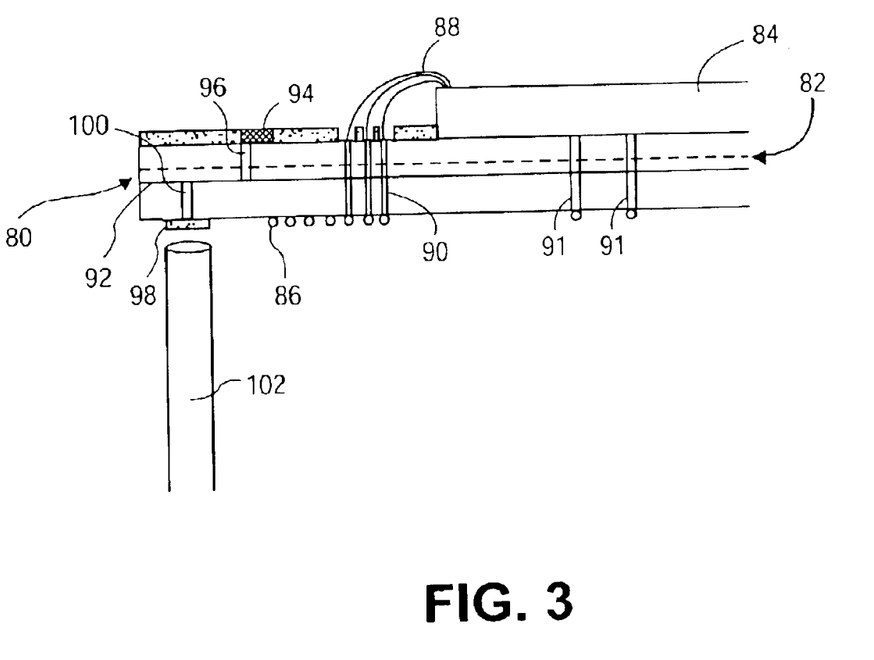
FIG. 3 is a cross-sectional, view of a ball-grid-array package having a ground pad in accordance with an embodiment of the invention.

FIG. 3 illustrates a more detailed cross-sectional view of a ball grid array package having a ground pad in an embodiment of the invention. There is a substrate 80. Substrate 80 may be made of organic material, and may be in two laminated parts having an interface 82 therebetween. A silicon integrated circuit die 84 is on substrate 80. An array of solder balls 86 provide electrical contact between the packaged die 84 and a board (not shown). Die 84 is electrically coupled to substrate 84 with wirebonds 88. Substrate 80 includes a series of interconnected leads (not shown) to form the electrical pathways from die 84 to an external board. Substrate is electrically grounded with an embedded ground plane 92, that extends within substrate 80. Electrical vias 90 provide an electrical conduit between the top surface of substrate 80 and the bottom surface containing solder balls 86. Thermal vias 91 provide a thermal dissipation route to a board, for heat generated by an operating die 84.

FIG. 3 incldes a top side ground pad 94, with a top side ground pad via 96 providing the electrical conduit between top side ground pad 94 and embedded ground plane 92. Bottom side ground pad 98 is shown on the bottom side of substrate 80 on the same side as solder balls 86. Bottom side ground pad 98 is electrically coupled to embedded ground plane 92 by way of bottom side ground pad via 100. Alternatively, bottom side ground pad 98 may not be coupled to a via but rather would be routed to a ball 86 that is dedicated to electrical ground. Ejection pin 102 is provided in FIG. 3 to demonstrate a physical mechanism to translate substrate 80 from one position to another, during a manufacturing step in which substrate 80 is handled. The context provided in this description has been a molding operation. However, the present invention would be useful in any step involving substrate handling, where there would be a need to dissipate static electric charge. Note that ejection pin 102 is shown to be aligned with bottom side ground pad 98 to ensure a degree of physical, metal-to-metal contact necessary to dissipate the static charge pursuant to desired manufacturing specifications.

Figure 4A:
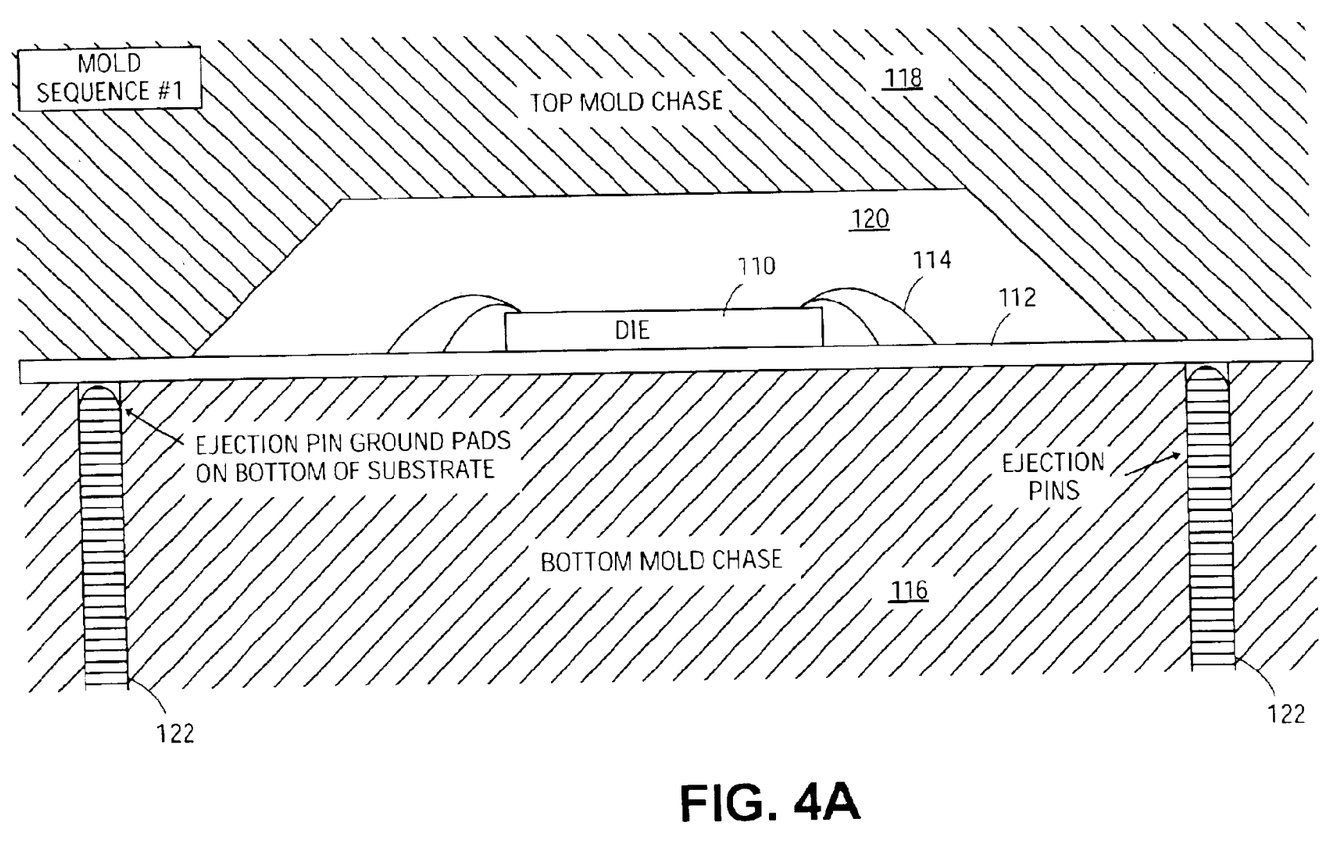
FIGS. 4A–D demonstrate a process sequence for using an embodiment of the present invention, using the context of a molding operation, shown in side view.

FIGS. 4A–4D illustrate steps in which the present invention may be used. FIG. 4A includes a die 110 that is sitting atop a package substrate 112. Die 110 and substrate 112 are electrically coupled by a set of wirebonds 114 extending from die 110 to points on substrate 112. Substrate 112 is sitting atop a bottom mold chase 116. Bottom mold chase 116 is a solid platform for supporting substrate 112 during a molding operation. Top mold chase 118 provides a cavity 120 for molding a protective cover over die 110. Ejection pins 122 reside in bottom mold chase 116 within through holes (not shown) in bottom mold chase 116, to allow ejection pins 122 to move vertically upward from a resting position.

Figure 4B:
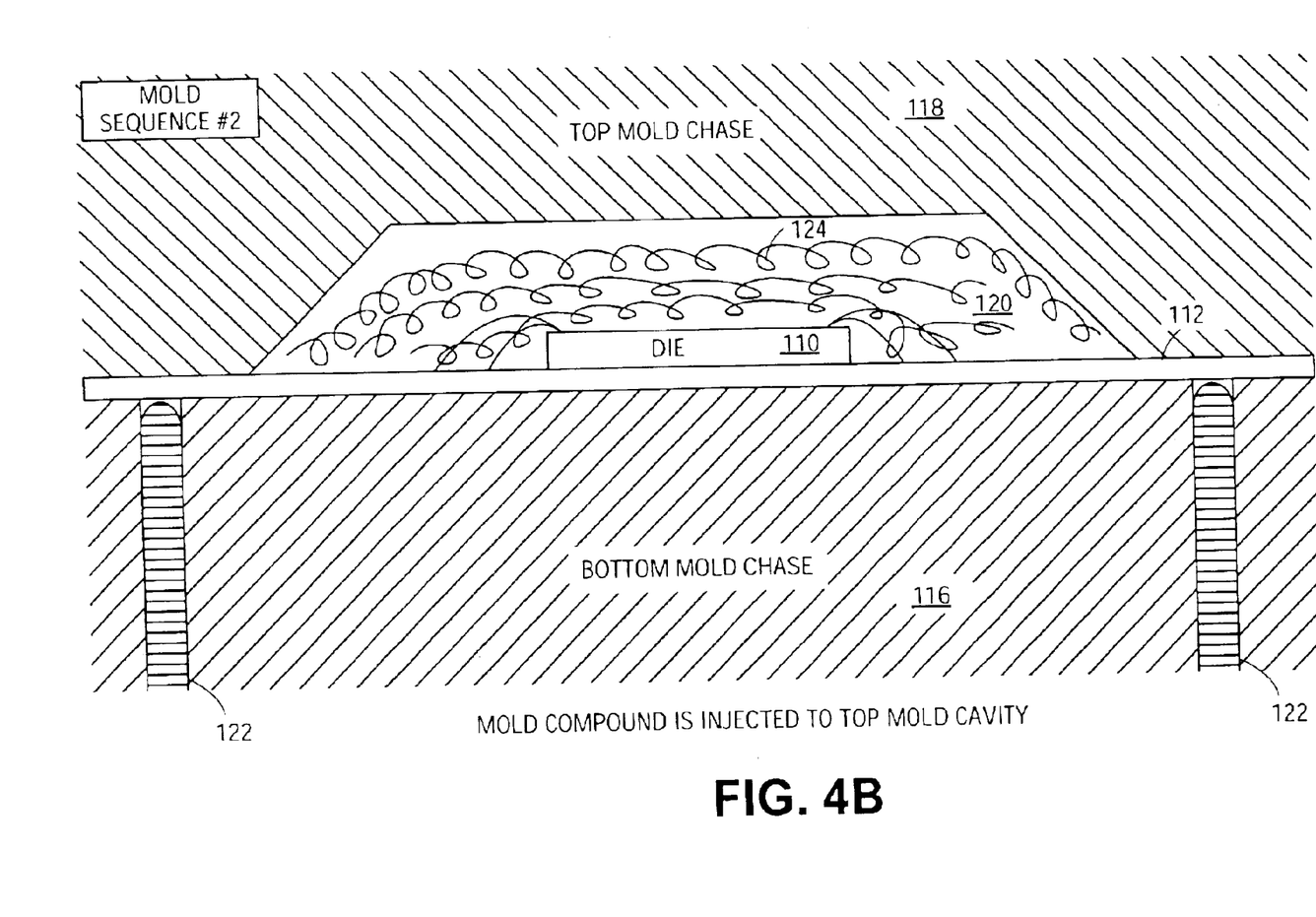

FIG. 4B illustrates the molding operation after a mold compound 124 is injected into cavity 120. This is done by inserting a pellet of soft mold in through a channel (not shown) in top mold chase 118. The pellet melts to form a coating over die 110 and wirebonds 114.

Figure 4C:
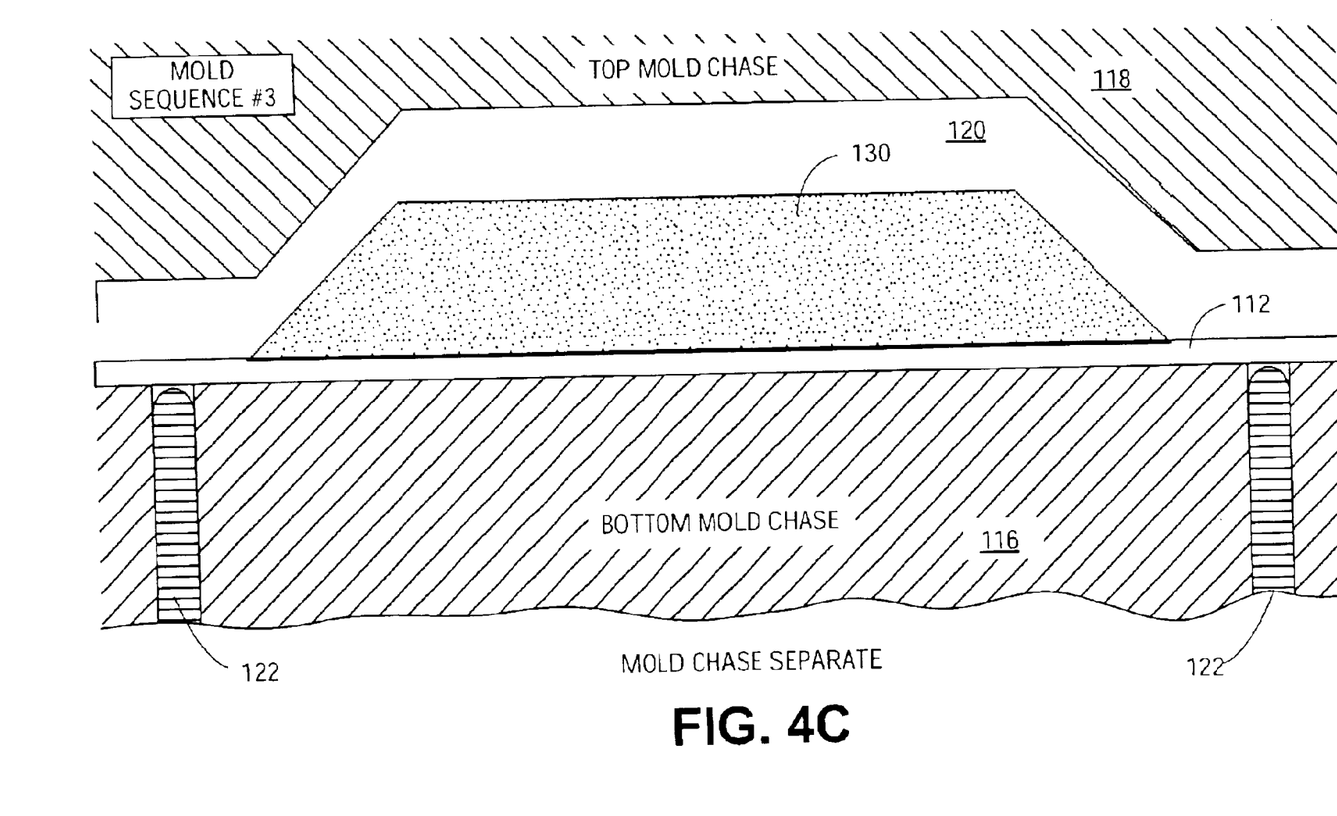

FIG. 4C shows the molding process after the pellet of soft mold hardens into a cover 130 that is in the shape of cavity 120. Substrate 112 remains sitting on bottom mold chase 115, and top mold chase 118 separates from bottom mold chase 116.

Figure 4D:
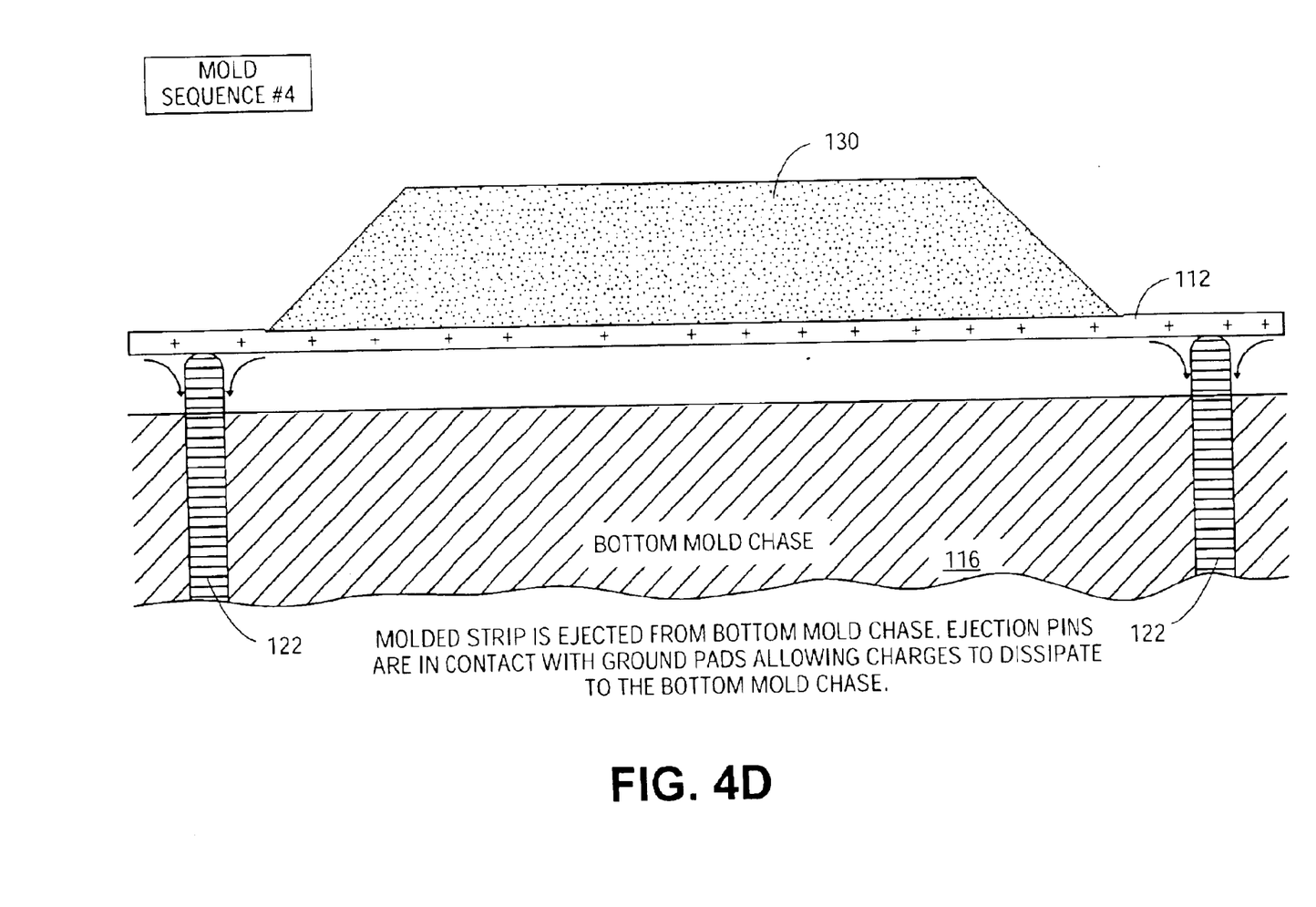

FIG. 4D shows the final step which separates substrate 112 from bottom mold chase 116. This is done by lifting ejection pins 122 in an upward, vertical direction, to cause substrate 112 to physically separate from bottom mold chase 116. Mold 130 is intact, and neither die 110 nor wirebonds 114 can be seen. The separation step shown in this FIG. 4D is done after a pause in time, to allow static electrical charge buildup 136 to dissipate through ejection pins 122. This pause in time should be as short as possible, but long enough to ensure that the static charge has dissipated sufficiently to safely lift substrate 112 from bottom mold chase 116. Following this final separation step, a robot handler physically lifts substrate 112 out of the mold chase to ready substrate 112 for a subsequent manufacturing step.

An apparatus and method for dissipating built up static electrical charge on a package substrate has been described. Ground pads are fabricated to be in electrical contact with ejection pins, to create a pathway for electrical charge dissipation through the ejection pins. This is advantageous for reducing the time pause otherwise necessary to dissipate static electrical charge at the end of a manufacturing step and before removing the substrate from the manufacturing apparatus. While embodiments of this invention have been described in the context of a ball grid array package substrate and a molding operation, it should be noted that the embodiments are not in any way limited to such contexts. The figures and accompanying descriptions have been provided for illustration and facilitation in understanding various embodiments of the invention. It should be known to a person of ordinary skill in the art that variations to the embodiments of the invention can be made without departing from the spirit and scope of the invention itself, which is encompassed in the claims below.

We claim:

1. A method of dissipating static electric charge from a chip assembly during a manufacturing operation, comprising the steps of:

providing a substrate which supports the chip assembly;

providing a ground pad on a surface of the substrate;

performing the manufacturing operation;

providing an ejection pin to translate the substrate from one position to another position;

electrically contacting the around pad and the ejection pin; and dissipating the static electric charge through the ejection pin.

2. A method of dissipating static electric charge as in claim 1, wherein electrically contacting the ground pad and the ejection pin comprises directly contacting the ground pad with the ejection pin.

3. A method of dissipating static electric charge as in claim 1, wherein performing the manufacturing operation comprises performing a molding operation.

4. A method of dissipating static electric charge as in claim 3, including the steps of:

providing a bottom mold chase and a top mold chase;

placing the substrate onto the bottom mold chase;

performing a molding operation by introducing a molding material into the top mold chase; and removing the substrate from the bottom mold chase by translating the ejection pin.

* * * * *

UNITED STATES PATENT AND TRADEMARK OFFICE
CERTIFICATE OF CORRECTION

PATENT NO. : 6,764,877 B2
DATED : July 20, 2004
INVENTOR(S) : Lin et al.

It is certified that error appears in the above-identified patent and that said Letters Patent is hereby corrected as shown below:

Column 6,
Line 26, delete "around" and insert -- ground --.

Signed and Sealed this

Seventh Day of December, 2004

JON W. DUDAS
*Director of the United States Patent and Trademark Office*